(12) United States Patent
Lim

(10) Patent No.: US 8,552,617 B2
(45) Date of Patent: Oct. 8, 2013

(54) ENERGY HARVESTING DEVICE USING PYROELECTRIC MATERIAL

(75) Inventor: Ji-hyuk Lim, Sumon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 422 days.

(21) Appl. No.: 12/835,351

(22) Filed: Jul. 13, 2010

(65) Prior Publication Data
US 2011/0169372 A1 Jul. 14, 2011

(30) Foreign Application Priority Data
Jan. 11, 2010 (KR) .................. 10-2010-0002383

(51) Int. Cl.
*H02N 10/00* (2006.01)

(52) U.S. Cl.
USPC ............................ 310/307; 310/306; 322/2 R

(58) Field of Classification Search
USPC .......... 310/306–307, 339; 318/117; 136/213; 322/2 R
See application file for complete search history.

(56) References Cited

U.S. PATENT DOCUMENTS

| | | | | |
|---|---|---|---|---|
| 4,626,964 A | | 12/1986 | Azuma et al. | |
| 5,188,286 A | * | 2/1993 | Pence, IV | 236/1 F |
| 5,825,275 A | * | 10/1998 | Wuttig et al. | 337/139 |
| 6,060,811 A | | 5/2000 | Fox et al. | |
| 6,127,765 A | * | 10/2000 | Fushinobu | 310/306 |
| 6,127,812 A | | 10/2000 | Ghezzo et al. | |
| 6,239,685 B1 | | 5/2001 | Albrecht et al. | |
| 6,312,816 B1 | * | 11/2001 | Roeder et al. | 428/432 |
| 6,483,056 B2 | * | 11/2002 | Hyman et al. | 200/181 |
| 6,528,898 B1 | * | 3/2003 | Ikura et al. | 290/1 R |
| 6,621,687 B2 | | 9/2003 | Lewis, Jr. et al. | |
| 6,768,230 B2 | | 7/2004 | Cheung et al. | |
| 6,914,343 B2 | | 7/2005 | Hiller et al. | |
| 7,057,330 B2 | | 6/2006 | Buhler et al. | |
| 7,157,835 B2 | | 1/2007 | Sakai | |
| 7,245,062 B2 | | 7/2007 | Schmidt | |
| 7,397,169 B2 | * | 7/2008 | Nersessian et al. | 310/339 |
| 7,444,812 B2 | * | 11/2008 | Kirkpatirck et al. | 60/528 |
| 7,453,187 B2 | | 11/2008 | Richards et al. | |
| 7,535,155 B2 | * | 5/2009 | Ishikawa | 310/339 |
| 7,556,978 B2 | | 7/2009 | Liu | |
| 7,800,278 B2 | * | 9/2010 | Ujihara et al. | 310/306 |
| 7,807,917 B2 | * | 10/2010 | Atanackovic | 136/236.1 |
| 7,982,360 B2 | * | 7/2011 | Erbil et al. | 310/306 |
| 2002/0043895 A1 | | 4/2002 | Richards et al. | |
| 2010/0037624 A1 | * | 2/2010 | Epstein et al. | 62/3.1 |
| 2010/0148519 A1 | * | 6/2010 | Shih et al. | 290/1 R |
| 2011/0109952 A1 | * | 5/2011 | Frank et al. | 359/221.2 |
| 2011/0298333 A1 | * | 12/2011 | Pilon | 310/306 |
| 2012/0056504 A1 | * | 3/2012 | Hunter et al. | 310/306 |

OTHER PUBLICATIONS

R.W. Whatmore, "Pyroelectric devices and materials" Rep.Prog. Phys. 49 (1986) 1335-1386.*
A Cuadras et al., "Energy Harvesting from PZT Pyroelectric Cells" Instrumentation and Measurement Technology Conference, Apr. 2006, 1668-1672.*

* cited by examiner

*Primary Examiner* — Burton Mullins
(74) *Attorney, Agent, or Firm* — Sughrue Mion, PLLC

(57) ABSTRACT

Provided is an energy harvesting device using pyroelectric materials. The energy harvesting device includes a first heat source; a second heat source having a temperature higher than a temperature of the first heat source; and a cantilever which is interposed between the first heat source and the second heat source, the cantilever including a first film formed of a pyroelectric material and a second film, where the first film is disposed on the second film and a thermal expansion coefficient of the second film is different from that of the pyroelectric material of the first film. Electric energy is generated by periodically changing a temperature within the first film.

9 Claims, 7 Drawing Sheets

ENERGY HARVESTING DEVICE USING PYROELECTRIC MATERIAL

CROSS-REFERENCE TO RELATED APPLICATIONS

This application claims priority from Korean Patent Application No. 10-2010-0002383, filed on Jan. 11, 2010, in the Korean Intellectual Property Office, the disclosure of which is incorporated herein in its entirety by reference.

BACKGROUND

1. Field

Apparatuses and methods consistent with the present disclosure relate to energy harvesting devices.

2. Description of the Related Art

Energy harvesting technologies are technologies for converting energy, such as vibrations, heat, light, radio frequency (RF), or the like, from the surrounding environment into electric energy by using a converting device. The efficiency of harvesting electric energy has continuously increased along with the developments of the structures and performances of energy harvesting devices. Furthermore, as the voltages and currents for driving semiconductor devices have decreased, electronic devices capable of performing various functions with reduced power consumption have been commercialized. Therefore, energy harvesting technologies may be used for many applications.

Energy harvesting technologies utilizing thermal energy may be used in environments where thermal energy is generated by a fixed heat source. For example, such technologies may be applied to health-care devices using the body temperature or small electronic devices, such as cellular phones, which generate heat. Furthermore, energy harvesting technologies may utilize waste heat from a power plant, heat generated by heating apparatuses in a household or a commercial building, or a temperature difference between the front and rear surfaces of a light collecting panel of a solar battery.

Temperature differences are generally converted into electric energy via thermoelectricity. In the case of using a thermoelectric material for generating a voltage V via a temperature difference $\Delta T$ between two opposite ends, electric energy may be obtained from the body temperature or waste heat. However, methods utilizing thermoelectricity have generally low efficiency.

SUMMARY

Provided are energy harvesting devices using pyroelectric materials.

Additional aspects will be set forth in part in the description which follows and, in part, will be apparent from the description, or may be learned by practice of the presented embodiments.

According to an aspect of a described embodiment, there is provided an energy harvesting device which includes a first heat source; a second heat source having a temperature higher than that of the first heat source; and a cantilever which is interposed between the first heat source and the second heat source and has a stacked structure including a first film formed of a pyroelectric material and a second film, where a thermal expansion coefficient of the second film is different from that of the pyroelectric material constituting the first film. Electric energy is generated by periodically changing a temperature within the first film.

The second film may be formed of a metallic material having a thermal expansion coefficient higher than that of the pyroelectric material.

The cantilever may be arranged such that the second film is located closer to the second heat source than is the first film.

The first film may include a first contact region, and a deformation of the cantilever may cause the first contact region to repeatedly contact and separate from the first heat source.

A portion of the second film may be fixed to the second heat source to support an end of the cantilever. Alternatively, the second heat source may be maintained at room temperature, and an end of the cantilever may be supported by a supporting unit. The second heat source may be the surrounding environment.

The second film may include a second contact region, and a deformation of the cantilever may cause the second contact region to repeatedly contact and separate from the second heat source.

A portion of the first film may be fixed to the first heat source to support an end of the cantilever. Alternatively, the first heat source may be maintained at room temperature, and an end of the cantilever may be supported by a supporting unit. The first heat source may be the surrounding environment.

The first film may include a first contact region contacting the first heat source, the second film may include a second contact region contacting the second heat source, and a deformation of the cantilever may cause alternating between a state in which the first contact region contacts the first heat source and a state in which the second contact region contacts the second heat source.

A portion of the first film may be fixed to the first heat source to support an end of the cantilever. Alternatively, a portion of the second film may be fixed to the second heat source to support an end of the cantilever.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
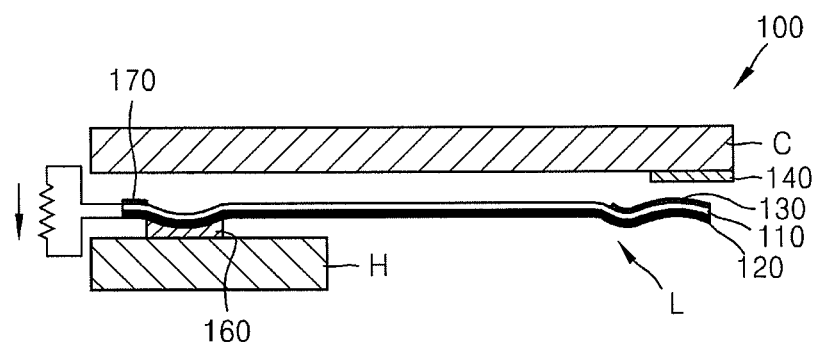
FIGS. 1A and 1B are diagrams showing the structure and operations of an energy harvesting device according to an embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

Energy harvesting devices according to embodiments described herein generate electric energy by using pyroelectric materials. Hereinafter, the mechanism of generating electric energy by using a pyroelectric material will be briefly described. When a pyroelectric material is heated or cooled, the locations of atoms within the crystal structures of the pyroelectric material are changed, and thus the size of an electric dipole is changed. As a result, a potential difference occurs within the pyroelectric material, and a current flows into a load when two opposite ends of the pyroelectric material are connected to an external circuit. The current flows in opposite directions when the temperature rises and drops, and the current magnitude is proportional to the rate of change of the temperature. The magnitude of a generated current I may be calculated using Equation 1 below.

$$I = A\lambda (dT/dt)$$ [Equation 1]

where, A is the surface area of the pyroelectric material, λ is the pyroelectric coefficient of the pyroelectric material, and dT/dt is the rate of change of temperature per unit time.

According to this mechanism, if the temperature continuously changes within the pyroelectric material according to temperature gradients around the pyroelectric material, a continuous current flow may be generated. In other words, electric energy may be generated from surrounding temperature gradients.

Embodiments described herein provide structures for continuously changing the temperature within a pyroelectric material by employing a stacked structure of a pyroelectric material and a material having a different thermal expansion coefficient from that of the pyroelectric material. Detailed descriptions thereof will be given below.

Figure 1B:
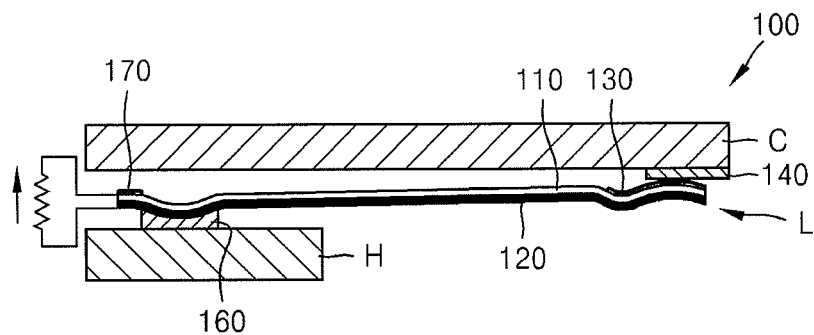

FIGS. 1A and 1B are diagrams showing the structure and operations of an energy harvesting device 100 according to an embodiment. The energy harvesting device 100 includes a first heat source C, a second heat source H, and a cantilever L interposed between the first heat source C and the second heat source H. The cantilever L has a stacked structure including a first film 110, which is formed of a pyroelectric material, and a second film 120, which is formed of a material having a thermal expansion coefficient different from that of the pyroelectric material constituting the first film 110. The second film 120 may be formed of a metallic material having a thermal expansion coefficient different from that of the pyroelectric material constituting the first film 110.

One end of the cantilever L may be supported by the second heat source H, by fixing a portion of the second film 120 to the second heat source H. A fixing layer 160 may be further formed between the portion of the second film 120 fixed to the second heat source H and the second heat source H. The properties of the fixing layer 160, e.g., thermal conductivity, are suitably determined in consideration of a temperature changing rate within the first film 110, and the fixing layer may be formed of a material having thermal conductivity lower that heat conducting layers 130, 140, and 150, described below. A rate at which a thermal energy from the second heat source H is transmitted to the first film 110 may be suitably adjusted based on materials constituting the fixing layer 160 and the shape of the fixing layer 160. The shape of the cantilever L is not limited to the shape shown in FIG. 1A. For example, another end of the cantilever L may have any shape for coming in contact with and separating from the first heat source C as the cantilever L is deformed.

Two opposite ends of the first film 110 are connected to external circuitries to generate a current flow based on a temperature changing rate within the first film 110. Although only one load is shown in FIG. 1A showing a direction in which a current flows, various circuit components may be further disposed to store electric energy generated by the current flow, if necessary. For example, a bridge diode for switching a direction of the current flows to a predetermined direction or a charging circuit for storing electric energy may be further used. An electric conducting layer 170 may be formed on a portion of the first film 110.

A pyroelectric material is a material which generates an electric current when a temperature thereof rises or drops. The energy harvesting device 100 employing a pyroelectric material according to the present embodiment includes the cantilever L having the structure described above, wherein a temperature repeatedly rises and drops within the pyroelectric material.

The cantilever L is arranged such that the second film 120 is located close to the second heat source H. In other words, the cantilever L has a stacked structure, in which the first film 110 and the second film 120 are stacked, such that a material having a higher thermal expansion coefficient is located relatively close to a heat source providing higher thermal energy. When the cantilever L is deformed as the temperature rises (or drops), the cantilever L contacts a heat source which causes a temperature drop (or rise), and thus the cantilever L regains the original shape. This process may be repeated.

This process will be described below in further detail. Thermal energy generated by the second heat source H is transmitted to the second film 120 and the first film 110. As the temperature rises within the first film 110, a current flows to an external load as shown in FIG. 1A. Meanwhile, the first film 110 and the second film 120 thermally expand as the temperature rises, wherein the expansion amount of the first film 110 is different from that of the second film 120 due to the different thermal expansion coefficients. In this case, the second film 120, which has a relatively high thermal expansion coefficient, expands more than the first film 110, so that the one end of the cantilever L is bent upward.

As the cantilever L is deformed, the cantilever L contacts the first heat source C as shown in FIG. 1B. The thermal energy generated by the first heat source C is transmitted to the first film 110 and the second film 120. The heat conducting layer 130 may be formed on a portion of the first film 110 contacting the first heat source C. Furthermore, the heat conducting layer 140 may be formed on a portion of the first heat source C contacting the first film 110. The first heat source C maintains a temperature lower than that of the second heat source H, and thus the temperatures drop within the first film 110 and the second film 120 as the cantilever L contacts the first heat source C. As the temperature drops within the first film 110, a current flows to the loads connected to two opposite ends of the first film 110 in a direction opposite to the direction in which a current flows in FIG. 1A. Furthermore, as the temperatures drop within the first film 110 and the second film 120, the first film 110 and the second film 120 contract.

In this case, the second film 120 having a relatively high thermal expansion coefficient contracts more than the first film 110, and thus the one end of the cantilever L is bent downward again as shown in FIG. 1A. These thermal cycles are repeated, and thus, the temperature difference between the first heat source C and the second heat source H may be continuously converted to electric energy.

Materials employed in the above structure will be described below in detail.

The first film 110 may be formed of a pyroelectric material, such as triglycine sulphate (TGS), LiTaO$_3$, (Pb(Zr,Ti)O$_3$) (PZT), ((Pb,La)TiO$_3$) (PLT), or PVDF. Generally, the thermal expansion coefficient of a PZT layer is from about 0.000004/K to about 0.000008/K.

The second film 120 may be formed of a metallic material, such as copper (Cu), aluminum (Al), or platinum (Pt). Generally, the thermal expansion coefficient of the metallic material is from about 0.000010/K to about 0.000020/K. These metallic materials have excellent thermal conductivity, and may be employed to form the heat conductive layers 130 and 140 at the location where the first film 110 and the first heat source C contact each other. Furthermore, as described below, the metallic materials may be employed to form the heat conductive layer 150 at the location where the second heat source H and the second film 120 contact each other.

Figure 2:
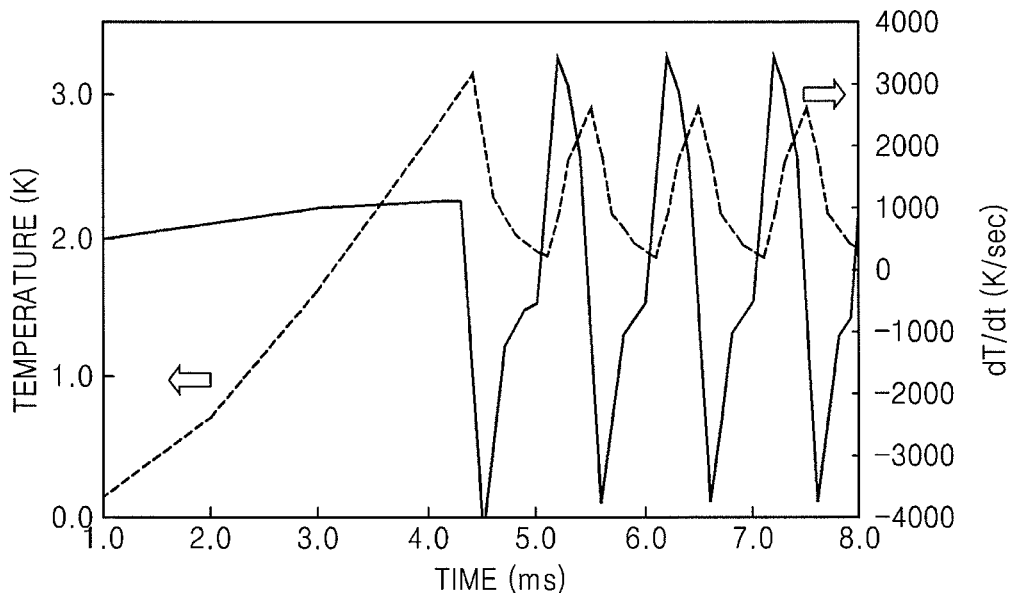
FIG. 2 is a graph showing simulations results of temperature changes within the pyroelectric material of the energy harvesting device according to the embodiment of FIGS. 1A and 1B and a temperature changing rate per second.

FIG. 2 is a graph showing simulations results of temperature changes within the pyroelectric material of the energy harvesting device 100 according to the previous embodiment of the present invention and a temperature changing rate per second. Here, it is assumed that a pyroelectric material constituting the first film 110 is LiTaO$_3$, a metallic material constituting the second film 120 is Al, and the temperature gradient is 5K. According to the graph shown in FIG. 2, thermal cycles appear in the energy harvesting device 100.

Figure 3:
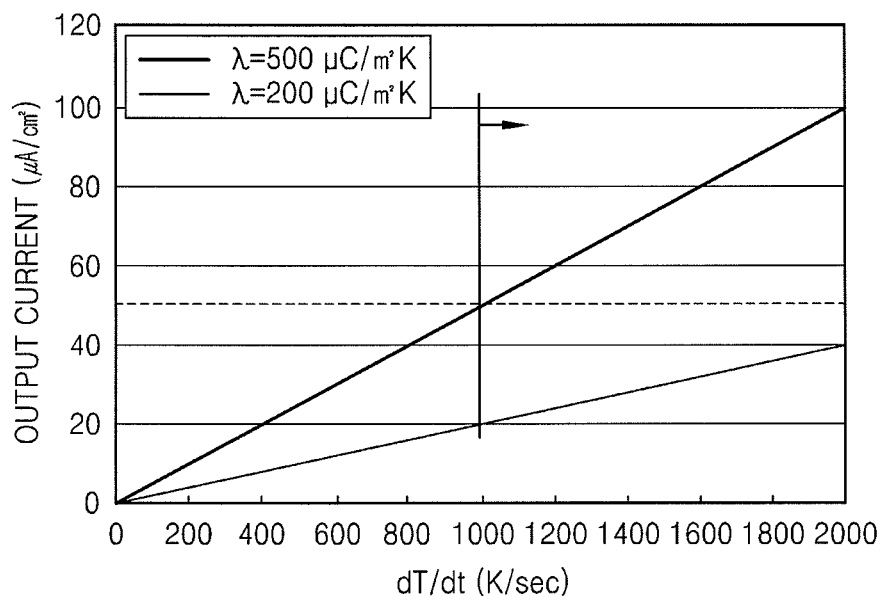
FIG. 3 is a graph showing output currents according to a temperature changing rate per second in two pyroelectric constants.

FIG. 3 is a graph showing output currents according to a temperature changing rate per second in two pyroelectric constants. Considering that the output current in the case of utilizing thermoelectricity is about 50 μA/cm$^2$, energy may be harvested at a higher efficiency by using a material having a pyroelectric constant equal to or greater than 500 μA/cm$^2$ and dT/dt is maintained equal to or greater than 1000 (K/sec), as compared to the case in which energy is harvested by utilizing thermoelectricity.

Figure 4A:
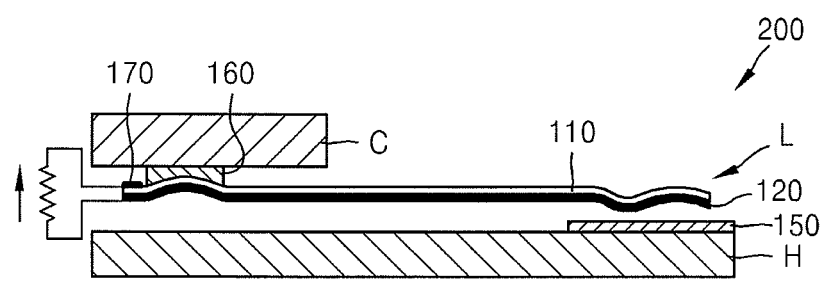
FIGS. 4A and 4B are diagrams showing the structure and operations of an energy harvesting device according to another embodiment.
Figure 4B:
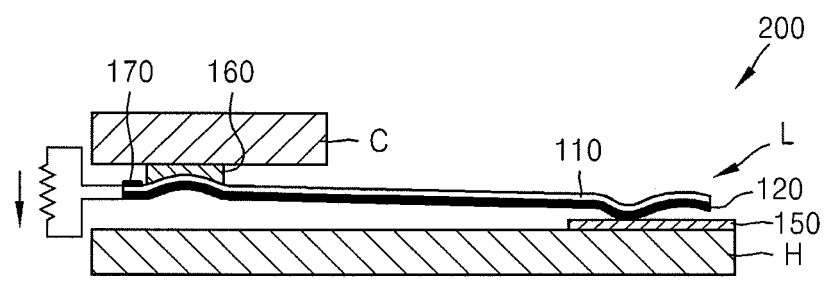

FIGS. 4A and 4B are diagrams showing the structure and operations of an energy harvesting device 200 according to another embodiment. The energy harvesting device 200 according to the present embodiment has a structure in which one end of the cantilever L is fixed to the first heat source C having a relatively low thermal energy, and a portion of the second film 120 of another end of the cantilever L is repeatedly switched to contact the second heat source H and separate from the second heat source H. The heat conducting layer 150 may be formed on the portion of the second heat source H which the second film 120 contacts. Referring to FIG. 4A, the one end of the cantilever L may be supported by the first heat source C, by fixing a portion of the first film 110 to the first heat source C, and the other end of the cantilever L does not contact the first heat source C or the second heat source H. The temperature drops within the first film 110 due to the first heat source C, and thus a current flows to a load. When the temperatures drop within the first film 110 and the second film 120, the second film 120 having a relatively high thermal expansion coefficient contracts more than the first film 110, and thus, the second end of the cantilever L is bent downward, so that the second film 120 contacts the second heat source H, as shown in FIG. 4B. As the cantilever L contacts the second heat source H, the temperature rises within the first film 110, and thus, a current flows to the loads in a direction opposite from the direction in which current flows in FIG. 4A. Furthermore, as the temperatures rise within the first film 110 and the second film 120, the second film 120 having a relatively high thermal expansion coefficient expands more than the first film 110, and thus, the second end of the cantilever L is bent upward again as shown in FIG. 4A.

Figure 5A:
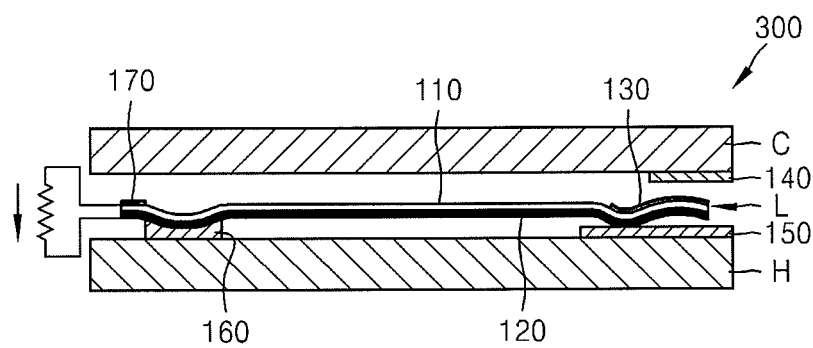
FIGS. 5A and 5B are diagrams showing the structure and operations of an energy harvesting device according to another embodiment.
Figure 5B:
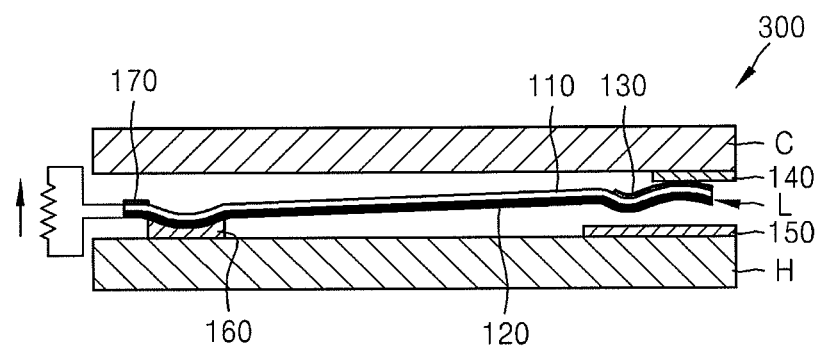

FIGS. 5A and 5B are diagrams showing the structure and operations of an energy harvesting device 300 according to another embodiment. In the present embodiment, one end of the cantilever L is fixed at the side of the second heat source H, and another end of the cantilever L is repeatedly switched to contact the first heat source C and contact to the second heat source H. The heat conducting layer 130 may be formed on a portion of the first film 110 which comes in contact with the first heat source C, and the heat conducting layer 140 may be formed on a portion of the first heat source C which comes in contact with the first film 110. Furthermore, the heat conducting layer 150 may be formed on a portion of the second heat source H which comes in contact with the second film 120. The shape of the cantilever L is not limited to that shown in FIGS. 5A and 5B. For example, the other end of the cantilever L may have any shape for coming in contact with the first heat source C and the second heat source H as the cantilever L is deformed.

Figure 6A:
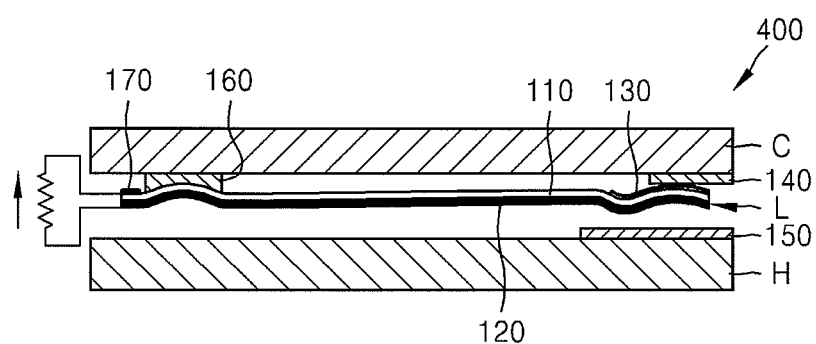
FIGS. 6A and 6B are diagrams showing the structure and operations of an energy harvesting device according to another embodiment.
Figure 6B:
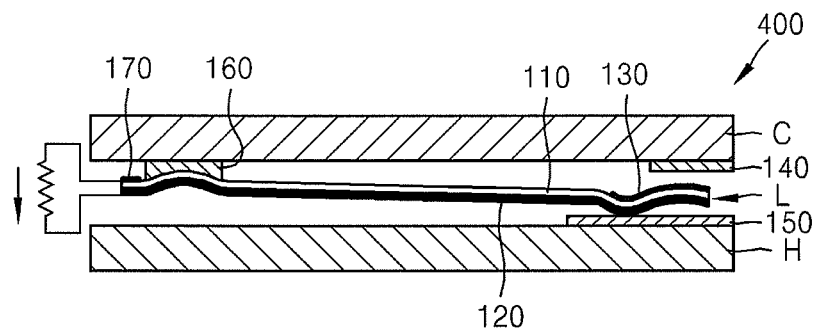

FIGS. 6A and 6B are diagrams showing the structure and operations of an energy harvesting device 400 according to another embodiment. The structure and operations of the energy harvesting device 400 according to the present embodiment are substantially identical to those of the energy harvesting device 300 shown in FIGS. 5A and 5B except that one end of the cantilever L is fixed at the side of the first heat source C.

Figure 7A:
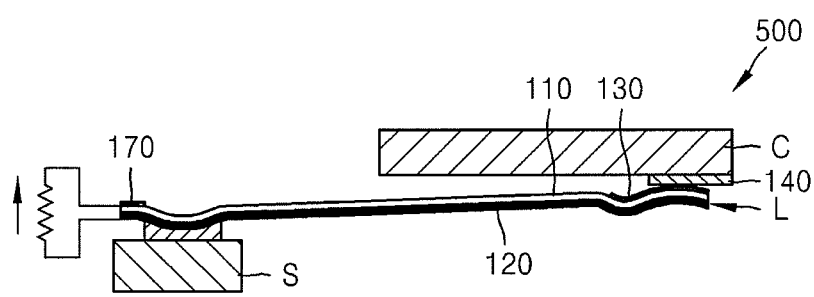
FIGS. 7A and 7B are diagrams showing the structure and operations of an energy harvesting device according to another embodiment.
Figure 7B:
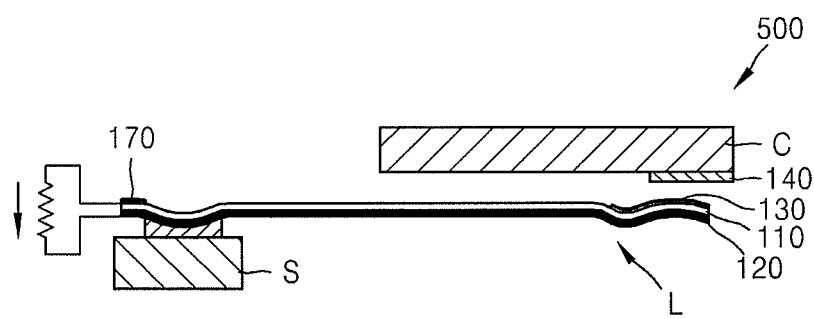

FIGS. 7A and 7B are diagrams showing the structure and operations of an energy harvesting device 500 according to another embodiment. The energy harvesting device 500 according to the present embodiment is configured to operate based on the temperature difference between the first heat source C, which has a lower thermal energy than that at room temperature, and the surrounding temperature. One end of the cantilever L is fixed and supported by a supporting unit S, whereas another end of the cantilever L is repeatedly deformed to come in contact and separate from the first heat source C.

Figure 8A:
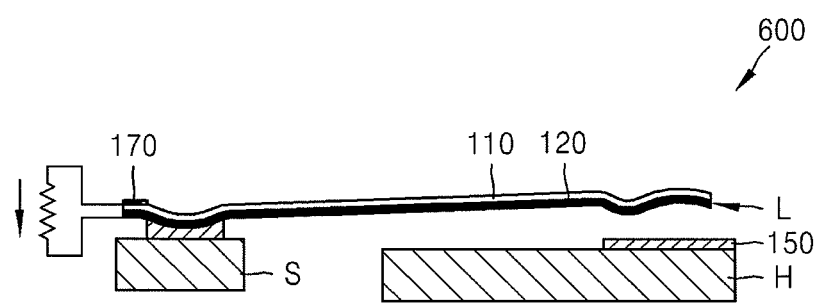
FIGS. 8A and 8B. are diagrams showing the structure and operations of an energy harvesting device according to another embodiment.
Figure 8B:
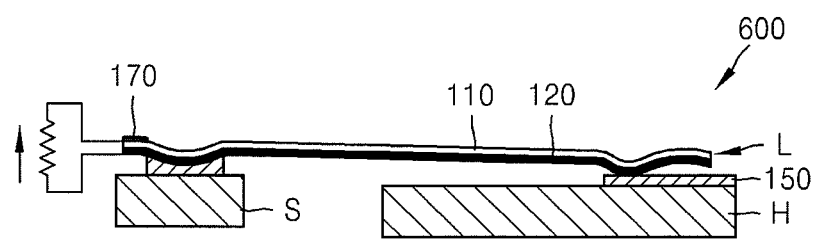

FIGS. 8A and 8B are diagrams showing the structure and operations of an energy harvesting device 600 according to another embodiment. The energy harvesting device 600 according to the present embodiment is configured to operate based on the temperature difference between the second heat source H, which has a higher thermal energy than that at room temperature, and the surrounding temperature. One end of the cantilever L is fixed and supported by the supporting unit S, whereas another end of the cantilever L is repeatedly deformed to come in contact and separate from the second heat source H.

As described above, according to the one or more of the embodiments described above, energy harvesting devices having a stacked structure including a pyroelectric material and a metallic material with a thermal expansion coefficient different from that of the pyroelectric material may efficiently harvest electric energy in environments with relatively small temperature differences.

It should be understood that the embodiments described herein should be considered in a descriptive sense only and not for purposes of limitation. Descriptions of features or aspects within each embodiment should typically be considered as available for other similar features or aspects in other embodiments.

What is claimed is:

1. An energy harvesting device comprising:
a first heat source;
a second heat source having a temperature higher than a temperature of the first heat source; and
a cantilever which is interposed between the first heat source and the second heat source, the cantilever comprising a first film formed of a pyroelectric material and a second film, wherein the first film is disposed on the second film and a thermal expansion coefficient of the second film is different from a thermal expansion coefficient of the pyroelectric material of the first film;
wherein the cantilever is disposed such that the second film is closer to the second heat source than the first film, and
at least a portion of the second film is fixed to the second heat source to support an end of the cantilever.

2. The energy harvesting device of claim 1, wherein the second film is formed of a metallic material having a thermal expansion coefficient higher than the thermal expansion coefficient of the pyroelectric material.

3. The energy harvesting device of claim 1, wherein the first film comprises a contact region contacting the first heat source, and
wherein a deformation of the cantilever causes the contact region to repeatedly contact and separate from the first heat source.

4. The energy harvesting device of claim 3, further comprising a heat conducting layer disposed on the contact region.

5. The energy harvesting device of claim 3, further comprising a heat conducting layer disposed on a portion of the first heat source which contacts the contact region.

6. The energy harvesting device of claim 1, wherein the first film comprises a first contact region contacting the first heat source,
the second film comprises a second contact region contacting the second heat source, and
a deformation of the cantilever causes alternating between a state in which the first contact region contacts the first heat source and a state in which the second contact region contacts the second heat source.

7. The energy harvesting device of claim 6, further comprising a heat conducting layer disposed on the first contact region.

8. The energy harvesting device of claim 6, further comprising a heat conducting layer disposed on a portion of the first heat source which contacts the first contact region.

9. The energy harvesting device of claim 6, further comprising a heat conducting layer disposed on a portion of the second heat source which contacts the second contact region.

* * * * *